United States Patent
U'ren

(10) Patent No.: US 7,064,073 B1
(45) Date of Patent: Jun. 20, 2006

(54) TECHNIQUE FOR REDUCING CONTAMINANTS IN FABRICATION OF SEMICONDUCTOR WAFERS

(75) Inventor: Gregory D. U'ren, Corona del Mar, CA (US)

(73) Assignee: Newport Fab, LLC, Newport Beach, CA (US)

( * ) Notice: Subject to any disclaimer, the term of this patent is extended or adjusted under 35 U.S.C. 154(b) by 185 days.

(21) Appl. No.: 10/434,961

(22) Filed: May 9, 2003

(51) Int. Cl.
*H01L 21/302* (2006.01)

(52) U.S. Cl. .................. 438/706; 438/710; 438/715; 134/1.1

(58) Field of Classification Search ............... 438/706, 438/710, 712, 715, 716; 134/1.1, 1.2; 117/95, 117/97

See application file for complete search history.

(56) References Cited

U.S. PATENT DOCUMENTS

| | | | |
|---|---|---|---|
| 6,277,194 B1 * | 8/2001 | Thilderkvist et al. | 117/94 |
| 6,471,771 B1 * | 10/2002 | Dietze | 117/97 |
| 6,596,095 B1 * | 7/2003 | Ries et al. | 148/33.1 |
| 2003/0073293 A1 * | 4/2003 | Ferro et al. | 438/478 |

FOREIGN PATENT DOCUMENTS

GB 0945892 A2 * 9/1999

* cited by examiner

*Primary Examiner*—Lan Vinh
(74) *Attorney, Agent, or Firm*—Farjami & Farjami LLP

(57) ABSTRACT

According to one embodiment, a method for reducing contaminants in a reactor chamber is disclosed where the method comprises a step of etching the reactor chamber, which can comprise, for example, a dry etch process performed with hydrogen and HCL. Next, the reactor chamber is baked, which can comprise, for example, baking with hydrogen. Thereafter, an undoped semiconductor layer, such as an undoped silicon layer, is deposited in the reactor chamber to form a sacrificial semiconductor layer, for example, a sacrificial silicon layer. Then, the sacrificial semiconductor layer, for example, the sacrificial silicon layer, is removed from the reactor chamber. The removal step can comprise, for example, a dry etch process performed with HCL. In another embodiment, a wafer is fabricated in a reactor chamber that is substantially free of contaminants due to the implementation of the above method.

21 Claims, 5 Drawing Sheets

US 7,064,073 B1

TECHNIQUE FOR REDUCING CONTAMINANTS IN FABRICATION OF SEMICONDUCTOR WAFERS

BACKGROUND OF THE INVENTION

1. Field of the Invention

The present invention is generally in the field of semiconductor fabrication. More specifically, the invention is in the field of reducing contaminants during semiconductor fabrication.

2. Background Art

In silicon-germanium ("SiGe") heterojunction bipolar transistor ("HBT") technology, SiGe HBTs are fabricated by techniques including, among other things, depositing doped silicon layers and undoped silicon layers on semiconductor dies, which occur in a reactor chamber. During deposition of doped silicon, dopants such as arsenic and phosphorous adhere to surfaces within the reactor chamber such as a susceptor, chamber sidewalls and the chamber's pre-heat ring.

HBT formation typically includes a "cleaning" process, which is performed after depositing doped silicon layers and before depositing undoped silicon layers, to reduce dopant concentration levels within a reactor chamber, which can contaminate undoped silicon layers during deposition. The cleaning process must reduce the concentration of dopants, i.e. contaminants, within a reactor chamber to less than $1 \times 10^{16}$ atoms per cubic centimeter (i.e. $1 \times 10^{16}$ cm$^{-3}$) to prevent contamination of undoped silicon during the undoped silicon deposition process.

One conventional cleaning process, referred to as "etch-coat", comprises etching the reactor chamber and thereafter coating the reactor chamber with undoped silicon. Disadvantageously, the etch-coat cleaning process cannot effectively reduce unwanted dopants when dopant concentration levels exceed $1 \times 10^{17}$ cm$^{-3}$. During HBT fabrication, dopant concentration levels can exceed $1 \times 10^{20}$ cm$^{-3}$. Thus, the etch-coat cleaning process is ineffective for some HBT fabrication processes.

Therefore, a need exists for reducing contaminants in a reactor chamber, which allows deposition of undoped semiconductors, such as undoped silicon, with reduced contamination from dopants left in the reactor chamber.

SUMMARY OF THE INVENTION

The present invention is directed to technique for reducing contaminants in fabrication of semiconductor wafers. The invention overcomes the need in the art for reducing contaminants in a reactor chamber, and allows deposition of undoped semiconductors, such as undoped silicon, with reduced contamination from dopants left in the reactor chamber.

According to one embodiment, the present invention is a method for reducing contaminants in a reactor chamber which comprises a step of etching the reactor chamber, which can comprise, for example, a dry etch process performed with hydrogen and HCL. Next, the reactor chamber is baked, which can comprise, for example, baking with hydrogen. Thereafter, an undoped semiconductor layer, such as an undoped silicon layer, is deposited in the reactor chamber to form a sacrificial semiconductor layer, for example, a sacrificial silicon layer. Then, the sacrificial semiconductor layer, for example, the sacrificial silicon layer, is removed from the reactor chamber. The removal step can comprise, for example, a dry etch process performed with HCL. In another embodiment, the present invention is a wafer fabricated in a reactor chamber that is substantially free of contaminants due to the implementation of the above method. Other features and advantages of the present invention will become more readily apparent to those of ordinary skill in the art after reviewing the following description and accompanying drawings.

DETAILED DESCRIPTION OF THE INVENTION

The present invention is directed to technique for reducing contaminants in fabrication of semiconductor wafers. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
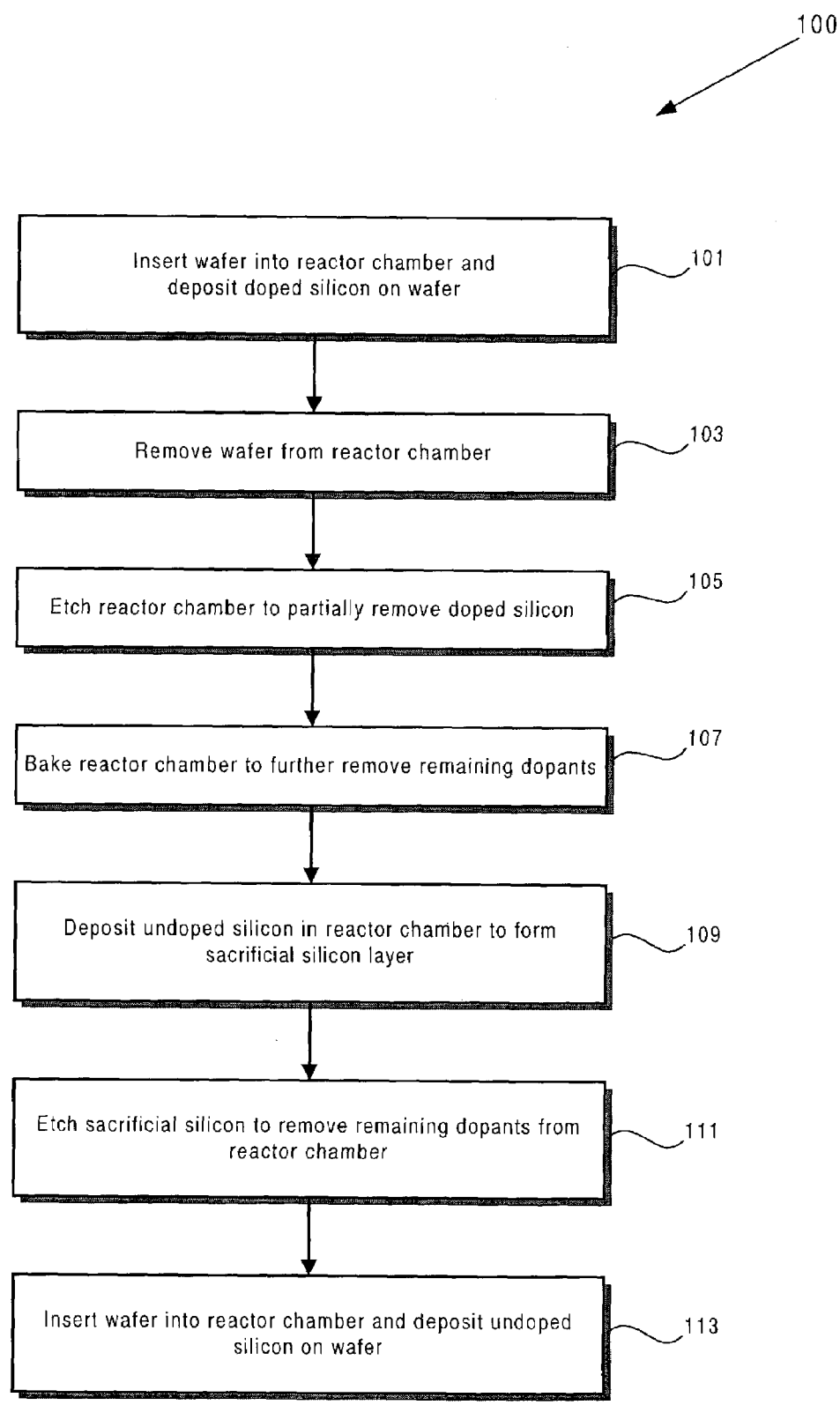
FIG. 1 shows a flowchart showing the steps taken to implement an embodiment of the invention.

FIG. 1 shows a flowchart illustrating exemplary process steps taken to implement an embodiment of the invention. Certain details and features have been left out of flowchart 100 of FIG. 1 that are apparent to a person of ordinary skill in the art. For example, a step may consist of one or more sub-steps or may involve specialized equipment or materials, as known in the art. While steps 101 through 113 shown in flowchart 100 are sufficient to describe one embodiment of the present invention, other embodiments of the invention may utilize steps different from those shown in flowchart 100. It is noted that the processing steps shown in flowchart 100 are performed in a reactor chamber capable of depositing undoped and doped silicon.

Figure 2A:
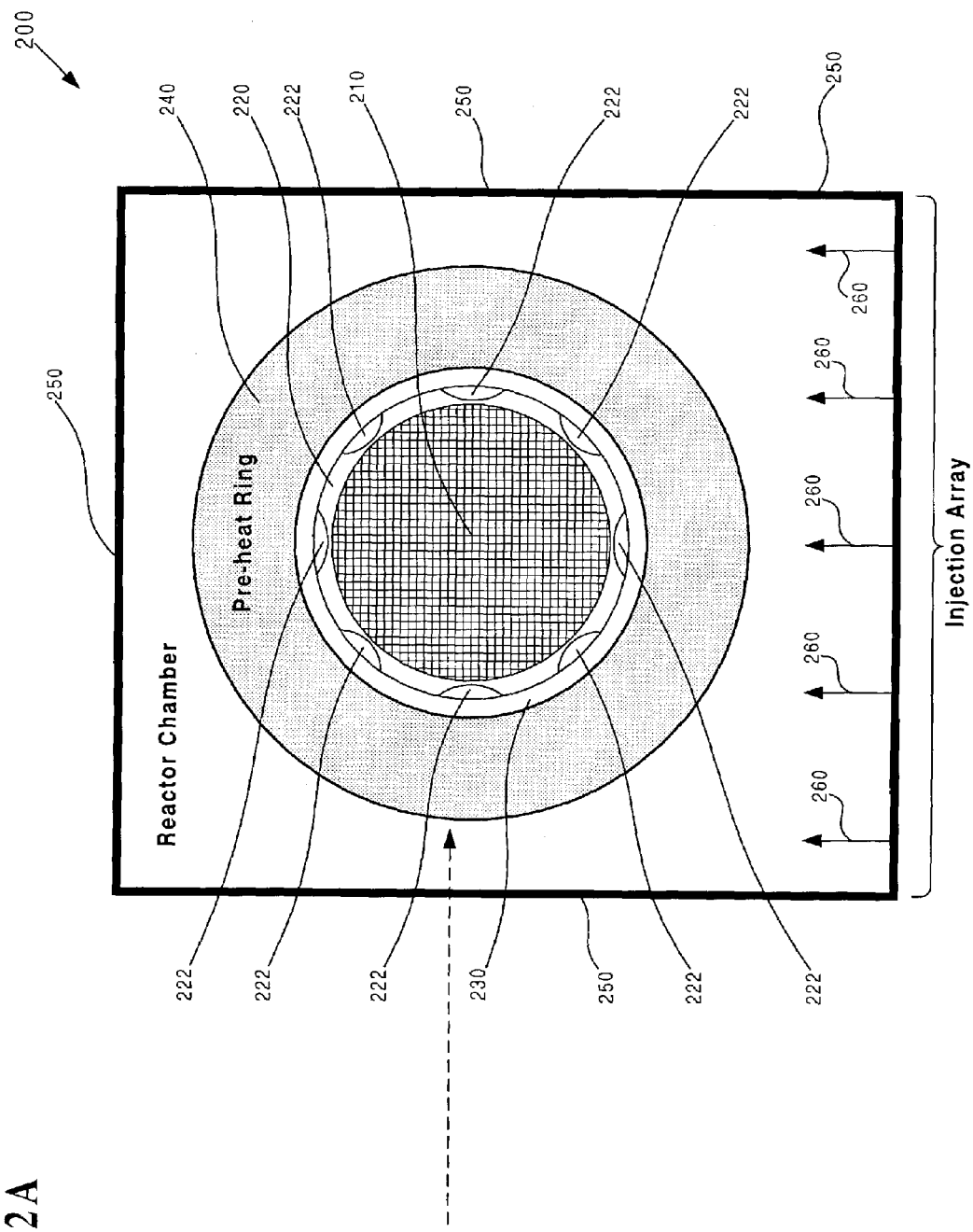
FIG. 2A shows a top view of a portion of a reactor chamber and a wafer after performance of a step of the flowchart in FIG. 1.

FIGS. 2A, 2B, 2C and 2D show views of some of the components of an exemplary reactor chamber utilized in processing a semiconductor wafer according to an embodiment of the invention. Referring to FIGS. 1 and 2A, at step 101 in flowchart 100, semiconductor wafer 210 is inserted into reactor chamber 200. As shown in FIG. 2A, reactor chamber 200 includes, among other things, susceptor 220, pre-heat ring 240, chamber sidewall 250 and injection array 260. Wafer 210 comprises a plurality of semiconductor dies and is situated on top surface of susceptor 220. Susceptor 220 is capable of rotating in either a clockwise or a counterclockwise direction. Susceptor 220 includes, among other things, positioners 222 which can comprise raised bumps and which help to maintain the position of wafer 210 at the center of the top surface of susceptor 220.

As shown in FIG. 2A, pre-heat ring 240 and susceptor 220 are separated by a small gap 230. Injection array 260 can comprise pinhole conduits through which various gases can be injected into reactor chamber 200 when desired. Pre-heat ring 240 encircles susceptor 220 and heats gases that flow from injection array 260 to susceptor 220 to suitable temperatures for wafer processing. For example, pre-heat ring 240 heats gases flowing from injection array 260 to susceptor 220 to a temperature of 690 degrees Centigrade ("C.") when susceptor 220 has a temperature of 690 degrees C.

Further at step 101 in flowchart 100, doped silicon is deposited on wafer 210 in reactor chamber 200. During deposition of doped silicon, dopants such as arsenic and phosphorous adhere to surfaces within reactor chamber 200 such as susceptor 220, positioners 222, chamber sidewall 250, and pre-heat ring 240. In one embodiment, the doped silicon comprises silicon and arsenic dopants having a dopant concentration level greater than $1 \times 10^{20}$ cm$^{-3}$. In one embodiment, the doped silicon comprises silicon and phosphorous dopants having a dopant concentration level greater than $1 \times 10^{20}$ cm$^{-3}$. In one embodiment, the doped silicon is deposited at 690 degrees C.

Figure 2B:
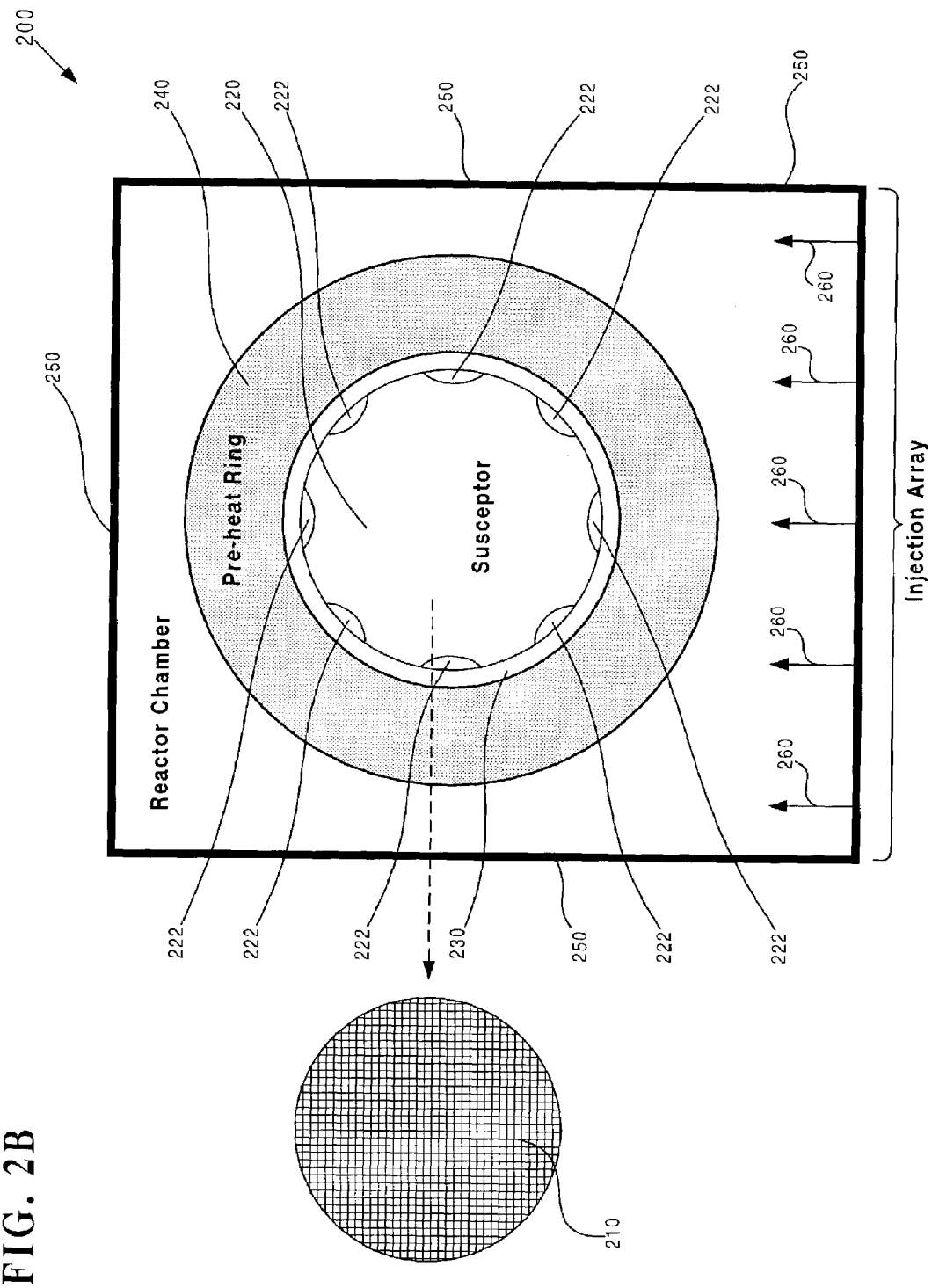
FIG. 2B shows a top view of a portion of a reactor chamber and a wafer after performance of a step of the flowchart in FIG. 1.

Referring to FIGS. 1 and 2B, at step 103 in flowchart 100, wafer 210 is removed from reactor chamber 200. As noted above, after using chamber 200 to deposit heavily doped silicon, chamber 200 should be free of dopants, such as arsenic or phosphorous, still residing in the chamber to prepare for depositing undoped silicon. The process of cleaning the chamber for depositing undoped silicon begins with removing wafer 210 from reactor chamber 200 at step 103. As seen in FIG. 2B, removing wafer 210 exposes top surface of susceptor 220 to the cleaning process, which process also includes cleaning other surfaces and components of reactor chamber 200 such as positioners 222, pre-heat ring 240, and chamber sidewall 250.

Figure 2C:
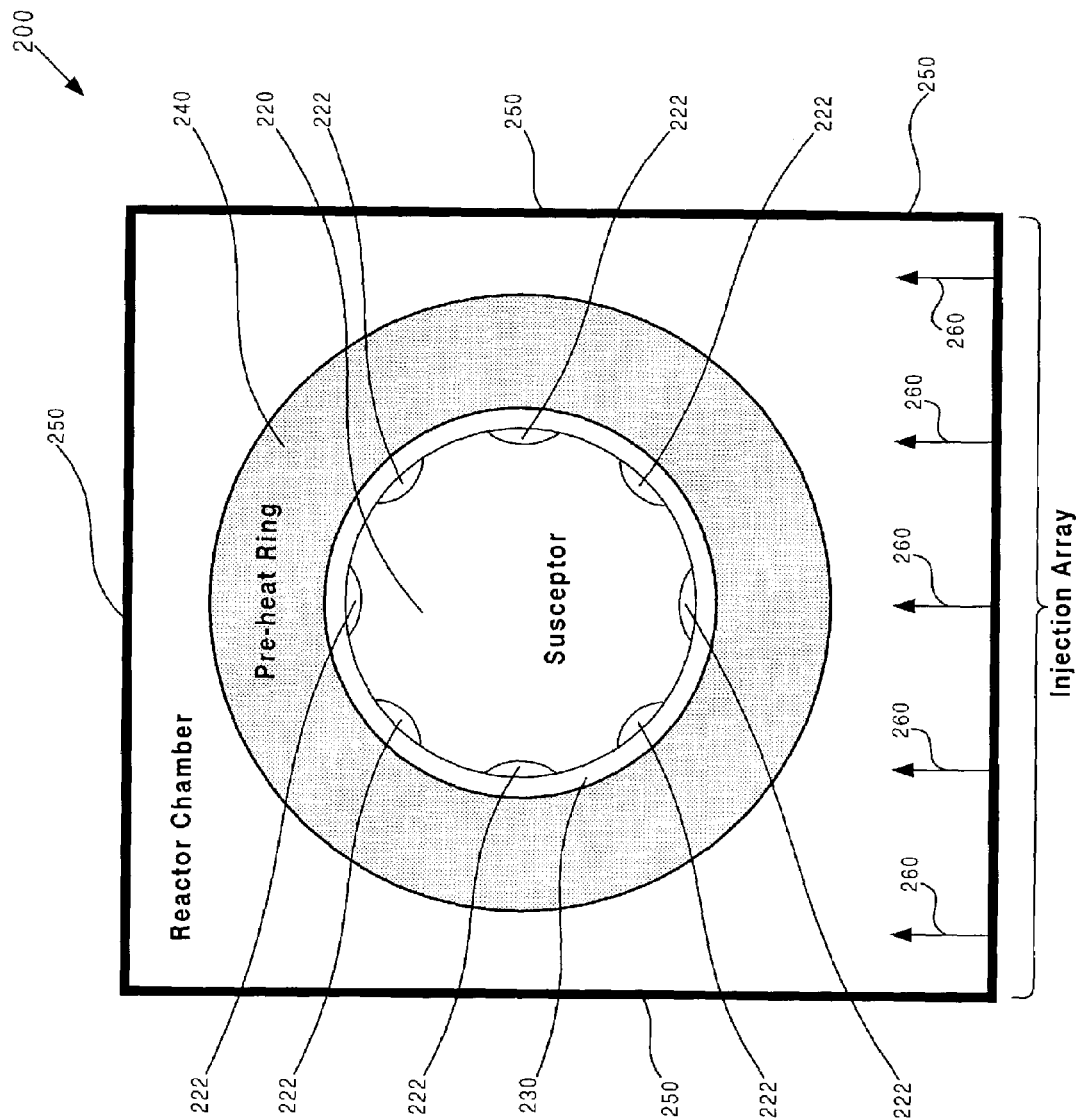
FIG. 2C shows a top view of a portion of a reactor chamber after performance of a step of the flowchart in FIG. 1.

Referring to FIGS. 1 and 2C, at step 105 in flowchart 100, reactor chamber 200 is etched to partially remove doped silicon. In one embodiment, a dry etch process with hydrogen and HCL is performed at approximately 1150 degrees C. The dry etch process results in partial removal of doped silicon, containing dopants such as arsenic and phosphorous, from various surfaces and components of reactor chamber 200 such as pre-heat ring 240, chamber sidewall 250, positioners 222, and top surface of susceptor 220.

Referring to FIGS. 1 and 2C, at step 107 in flowchart 100 and in accordance with the present invention, reactor chamber 200 is baked to further remove remaining dopants, such as arsenic and phosphorous, from various surfaces and components of reactor chamber 200 such as pre-heat ring 240, chamber sidewall 250, positioners 222, and top surface of susceptor 220. Baking evaporates dopants, which can be swept out through a reactor chamber exhaust system (not shown in any of the Figures). In one embodiment, reactor chamber 200 is baked with hydrogen at approximately 1150 degrees C.

Referring to FIGS. 1 and 2C, at step 109 in flowchart 100, undoped silicon is deposited in reactor chamber 200 to form a sacrificial silicon layer. In one embodiment, undoped silicon is deposited at approximately 950 degrees C. During this step, dopants adhering to surfaces inside reactor chamber 200, e.g. chamber sidewall 250, pre-heat ring 240, positioners 222, and susceptor 220, diffuse into the undoped silicon, which forms the sacrificial silicon layer.

Referring to FIGS. 1 and 2C, at step 111 in flowchart 100, and in accordance with the present invention, the sacrificial silicon layer deposited during step 109 is etched to remove the remaining dopants in reactor chamber 200 from surfaces and components such as chamber sidewall 250, pre-heat ring 240, positioners 222, and susceptor 220. In one embodiment, a dry etch process with HCL is performed at approximately 1150 degrees C., which can reduce the dopant concentration level from greater than $1 \times 10^{20}$ cm$^{-3}$ to less than $1 \times 10^{16}$ cm$^{-3}$.

Figure 2D:
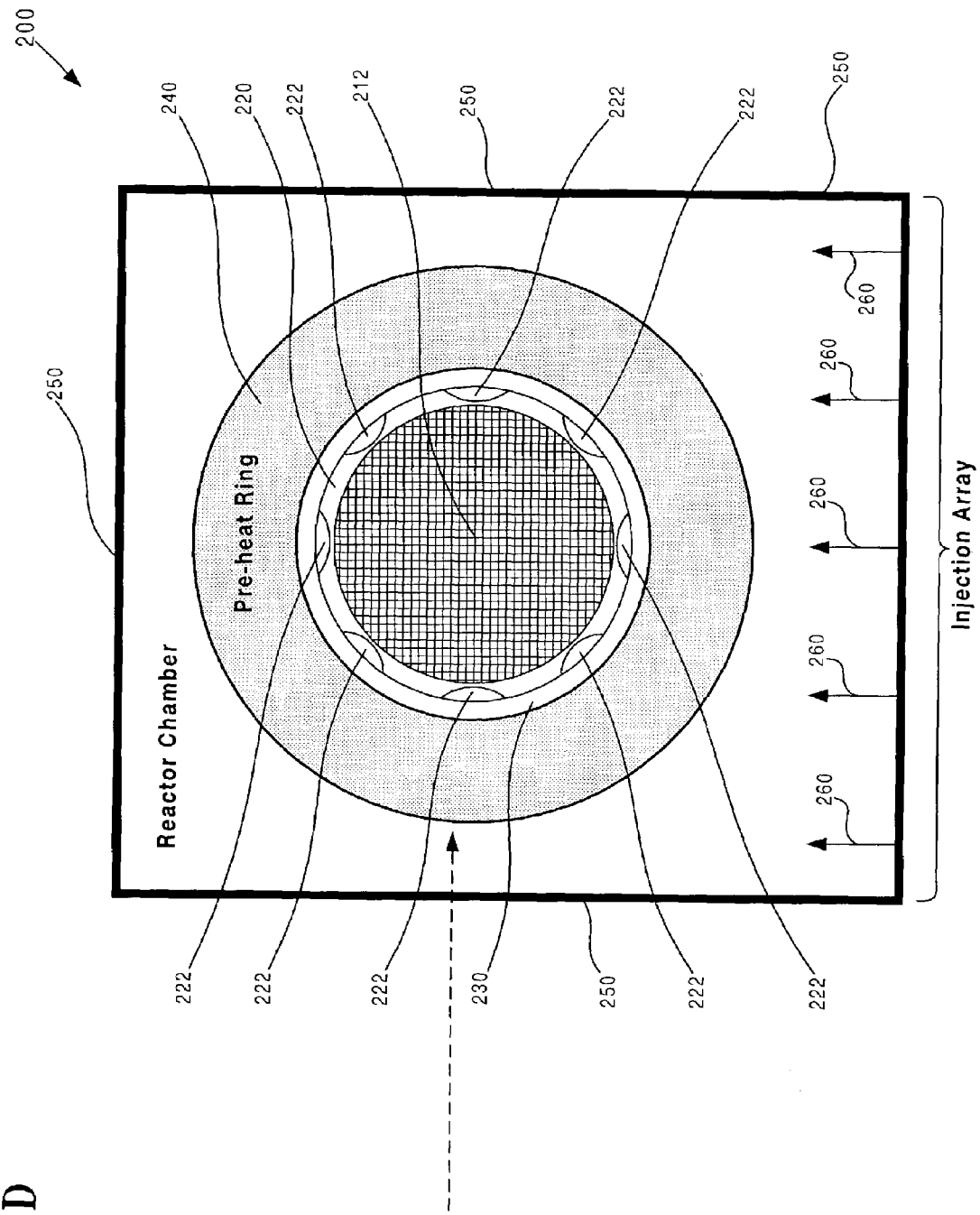
FIG. 2D shows a top view of a portion of a reactor chamber and a wafer after performance of a step of the flowchart in FIG. 1.

Referring to FIGS. 1 and 2D, at step 113 in flowchart 100, wafer 212 is inserted into reactor chamber 200 and undoped silicon is deposited on wafer 212 in reactor chamber 200. In one embodiment, undoped silicon is deposited at 690 degrees C. In one embodiment, the undoped silicon has a dopant concentration level of less than $1 \times 10^{16}$ cm$^{-3}$. Wafer 212 can be wafer 210 of FIGS. 2A and 2B or a new wafer. In sum, the present invention results in substantial removal of contaminants, such as arsenic or phosphorous dopants, undesirably left in a reactor chamber during fabrication of semiconductor wafers and, as such, the reactor chamber can be effectively utilized for depositing undoped semiconductors, such as undoped silicon.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. For example, the present invention can be utilized to remove dopants other than those specifically mentioned in the present application. Moreover, various elemental or compound semiconductors, other than silicon, can be used to practice the present invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, technique for reducing contaminants in fabrication of semiconductor wafers has been described.

The invention claimed is:

1. A method for reducing contaminants in a reactor chamber, said method comprising steps of:
    etching said reactor chamber to remove dopants within said reactor chamber;
    baking said reactor chamber after said step of etching said reactor chamber;
    depositing an undoped semiconductor layer on at least one surface of said reactor chamber to form a sacrificial semiconductor layer after said step of baking said reactor chamber;
    removing said sacrificial semiconductor layer from said at least one surface of said reactor chamber.

2. The method of claim 1 wherein said undoped semiconductor layer is an undoped silicon layer and wherein said sacrificial semiconductor layer is a sacrificial silicon layer.

3. The method of claim 1, wherein said step of etching said reactor chamber comprises a dry etch process.

4. The method of claim 3, wherein said dry etch process is performed with hydrogen and HCL.

5. The method of claim 1, wherein said step of baking said reactor chamber comprises steps of:
evaporating a portion of said dopants remaining within said reactor chamber;
removing said portion of said dopants from said reactor chamber by a reactor chamber exhaust system.

6. The method of claim 1, wherein said step of baking said reactor chamber comprises baking with hydrogen.

7. The method of claim 2, wherein said sacrificial silicon layer comprises silicon and diffused dopants.

8. The method of claim 2, wherein said step of removing said sacrificial silicon layer from said at least one surface of said reactor chamber comprises a dry etch process.

9. The method of claim 8, wherein said dry etch process is performed with HCL.

10. The method of claim 1, wherein prior to said step of etching said reactor chamber, said method comprises steps of:
inserting a wafer in said reactor chamber;
depositing a doped semiconductor layer having a first dopant concentration level on said wafer;
removing said wafer from said reactor chamber.

11. The method of claim 2, wherein prior to said step of etching said reactor chamber, said method comprises steps of:
inserting a wafer in said reactor chamber;
depositing a doped silicon layer having a first dopant concentration level on said wafer;
removing said wafer from said reactor chamber.

12. The method of claim 11, wherein after said step of removing said sacrificial silicon layer, said method comprises steps of:
re-inserting said wafer in said reactor chamber;
depositing undoped silicon having a second dopant concentration level on said wafer, wherein said second dopant concentration level is less than said first dopant concentration level.

13. A method for reducing contaminants in a reactor chamber, said method comprising steps of:
etching said reactor chamber with a first dry etch process performed with hydrogen and HCL to remove dopants within said reactor chamber;
baking said reactor chamber with hydrogen after said step of etching said reactor chamber;
depositing an undoped silicon layer on at least one surface of said reactor chamber to form a sacrificial silicon layer after said step of baking said reactor chamber;
removing said sacrificial silicon layer from said at least one surface of said reactor chamber with a second dry etch process performed with HCL.

14. The method of claim 13, wherein prior to said step of etching said reactor chamber, said method comprises steps of:
inserting a wafer in said reactor chamber;
depositing doped silicon having a first dopant concentration level on said wafer;
removing said wafer from said reactor chamber.

15. The method of claim 14, wherein after said step of removing said sacrificial silicon layer, said method comprises steps of:
re-inserting said wafer in said reactor chamber;
depositing undoped silicon having a second dopant concentration level on said wafer, wherein said second dopant concentration level is less than said first dopant concentration level.

16. The method of claim 13, wherein said step of baking said reactor chamber with hydrogen comprises steps of:
evaporating a portion of said dopants remaining within said reactor chamber;
removing said portion of said dopants from said reactor chamber by a reactor chamber exhaust system.

17. A wafer fabricated in a reactor chamber comprising a sidewall, a pre-heat ring, a susceptor, and a plurality of positioners, said reactor chamber having been cleaned with a method comprising steps of etching said reactor chamber with a first dry etch process performed with hydrogen and HCL to remove dopants from said reactor chamber, baking said reactor chamber with hydrogen after said step of etching said reactor chamber; depositing an undoped silicon layer on at least one surface of said reactor chamber to form a sacrificial silicon layer after said step of baking said reactor chamber; and removing said sacrificial silicon layer from said at least one surface of said reactor chamber with a second dry etch process performed with HCL.

18. The wafer of claim 17, wherein prior to said step of etching said reactor chamber, said method comprises placing said wafer on said susceptor of said reactor chamber; depositing doped silicon having a first dopant concentration level on said wafer; and removing said wafer from said reactor chamber.

19. The wafer of claim 18 wherein after said step of removing said sacrificial silicon layer, said method comprises steps of re-inserting said wafer in said reactor chamber; and depositing undoped silicon having a second dopant concentration level on said wafer, wherein said second dopant concentration level is less than said first dopant concentration level.

20. The wafer of claim 19, wherein said step of baking said reactor chamber with hydrogen comprises steps of evaporating a portion of said dopants remaining within said reactor chamber; and removing said portion of said dopants from said reactor chamber by a reactor chamber exhaust system.

21. A method for reducing contaminants in a reactor chamber, said method comprising steps of:
inserting a wafer in said reactor chamber;
depositing a doped silicon layer having a first dopant concentration level on said wafer;
removing said wafer from said reactor chamber;
etching said reactor chamber;
baking said reactor chamber;
depositing an undoped semiconductor layer in said reactor chamber to form a sacrificial semiconductor layer, wherein said undoped semiconductor layer is an undoped silicon layer, wherein said sacrificial semiconductor layer is a sacrificial silicon layer;
removing said sacrificial semiconductor layer from said reactor chamber;
re-inserting said wafer in said reactor chamber;
depositing undoped silicon having a second dopant concentration level on said wafer, wherein said second dopant concentration level is less than said first dopant concentration level.

* * * * *

UNITED STATES PATENT AND TRADEMARK OFFICE
CERTIFICATE OF CORRECTION

| | |
|---|---|
| PATENT NO. | : 7,064,073 B1 |
| APPLICATION NO. | : 10/434961 |
| DATED | : June 20, 2006 |
| INVENTOR(S) | : Greg U'Ren |

It is certified that error appears in the above-identified patent and that said Letters Patent is hereby corrected as shown below:

In the claims, column 6, line 12, "reactor chamber, baking" should be changed to --reactor chamber; baking--.

Signed and Sealed this

First Day of July, 2008

JON W. DUDAS
*Director of the United States Patent and Trademark Office*